(12) United States Patent
Tang et al.

(10) Patent No.: US 6,329,589 B1
(45) Date of Patent: Dec. 11, 2001

(54) SOLAR PANEL

(76) Inventors: John Wing-Yan Tang, Suite 1301, Hollywood Plaza, 610 Nathan Road, Mongkok, Kowloon (HK); Tai-Yan Tang, 176 Kirkbridge Drive, Winnipeg, Manitoba (CA), R3T 5K2

( * ) Notice: Subject to any disclaimer, the term of this patent is extended or adjusted under 35 U.S.C. 154(b) by 0 days.

(21) Appl. No.: 09/532,009

(22) Filed: Mar. 21, 2000

(51) Int. Cl.⁷ .......................... H01L 31/042; H02N 6/00
(52) U.S. Cl. .................. 136/293; 136/244; 136/251; 136/291; 257/433; 257/434; 363/15; 363/13; 363/16; 52/173.3; 323/906
(58) Field of Search ........................... 136/244, 251, 136/291, 293; 257/433, 434; 363/15, 13, 16; 52/173.3; 323/906

(56) References Cited

U.S. PATENT DOCUMENTS

| 4,475,031 | * | 10/1984 | Mockovciak, Jr. | 136/291 |
| 4,695,935 | * | 9/1987 | Oen et al. | 363/21 |
| 4,942,352 | | 7/1990 | Sano | 320/134 |
| 5,008,062 | | 4/1991 | Anderson et al. | 264/272.15 |
| 5,128,181 | * | 7/1992 | Kunert | 136/291 |
| 5,213,626 | * | 5/1993 | Paetz | 136/244 |
| 5,221,363 | * | 6/1993 | Gillard | 136/248 |
| 5,228,925 | * | 7/1993 | Nath et al. | 136/251 |
| 5,898,585 | * | 4/1999 | Sirichote et al. | 363/132 |

FOREIGN PATENT DOCUMENTS

2189097 * 10/1987 (GB) .

* cited by examiner

Primary Examiner—Alan Diamond
(74) Attorney, Agent, or Firm—Leydig, Voit & Mayer, Ltd.

(57) ABSTRACT

A solar panel arrangement for capturing solar energy and supplying power for use in a building. Solar cells are embedded in a window pane and generate electrical direct current that is converted, by an electrical circuit permanently attached to the pane, to an oscillating current that is fed to a ferrite core mounted to the pane. An external ferrite core is mounted in close proximity to the core, so that the oscillating current can be picked up and supplied to a building. The arrangement allows window panes to be pre-formed or manufactured with certain built-in electrical components, and, without the need for skilled labor, to be easily connected to a power circuit external of the window pane.

4 Claims, 3 Drawing Sheets

SOLAR PANEL

BACKGROUND OF THE INVENTION

1. Field of the Invention

The invention relates to solar panels.

2. Description of Prior Art

Solar panels are well-known-for capturing solar energy and converting the energy into electric power. Such panels may be provided in windows that are otherwise used in a generally normal fashion in sides of buildings. At present, the electrical connections for leading power away from the buildings are cumbersome and require skilled labor and time to formulate or make-good so that the solar power can be made use of inside the building.

SUMMARY OF THE INVENTION

It is an object of the invention to overcome or at least reduce this problem.

According to the invention there is provided a solar panel arrangement in a window pane comprising a number of solar cells and an electrical circuit permanently connected electrically to the solar cells that converts direct current generated by solar energy in the cells into oscillations, and a ferrite core mounted to the window pane to which the oscillations are applied in use.

The circuit preferably includes an adjustable controller mounted to the pane for changing the oscillations and arranged to be remotely adjustable from externally of the pane. The controller may be a photo-transistor.

The solar panel arrangement may include an electrical external circuit for conveying power from the window pane includes a second ferrite core arranged to be mounted in close proximity with the said ferrite core. The external electrical circuit may comprise a wound coil arranged to fit over the said ferrite core.

BRIEF DESCRIPTION OF THE INVENTION

A solar panel arrangement according to the invention will now be described by way of example with reference to the accompanying drawings in which.

DESCRIPTION OF THE PREFERRED EMBODIMENTS

Figure 1:
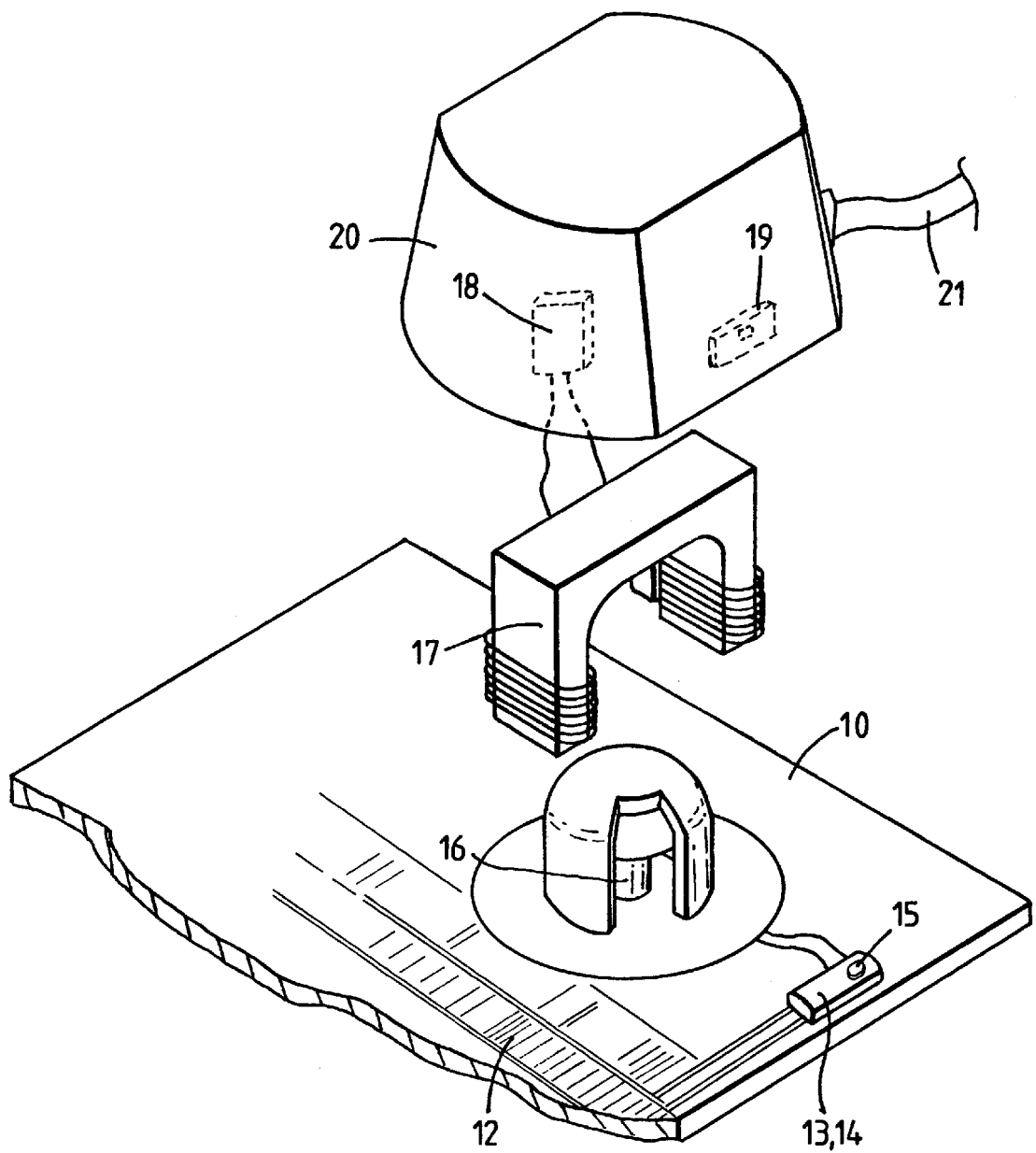
FIG. 1 is an isometric exploded view of part of the solar panel.

Referring to the drawings, a glass window pane 10 is embedded with a number of photovoltaic solar cells 12 that convert solar energy into direct current in a manner and configuration that is well-known. Electrical components, forming part of an overall power capturing circuit and described below, are also embedded in or permanently mounted to the window pane 10. A ferrite core 16 is also mounted to the window pane, preferably adjacent one side or one corner of the corner of the pane, as shown.

Figure 2:
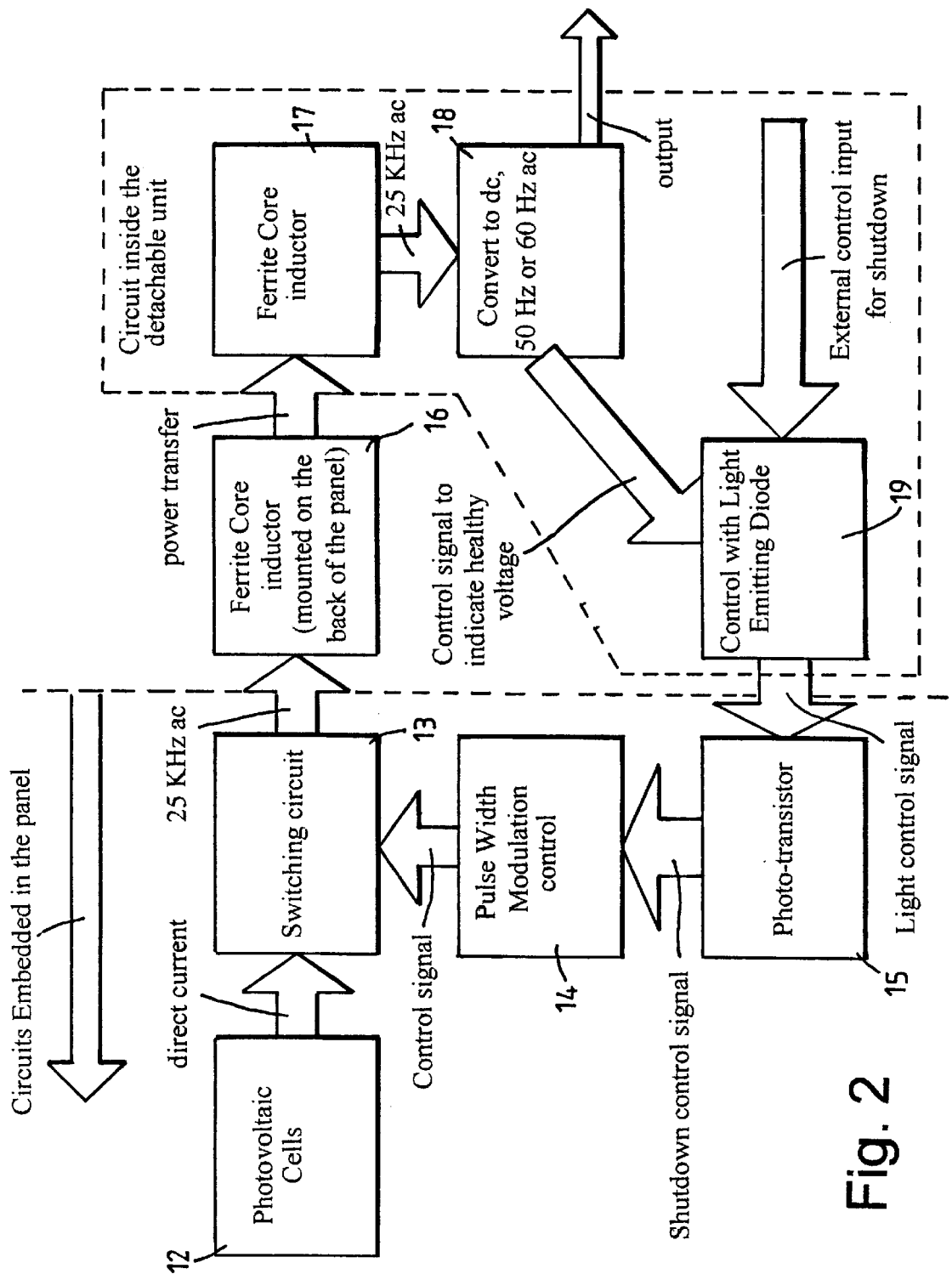
FIG. 2 is a schematic drawing of electrical components of the panel.

In FIG. 2, electrical components that are permanently fixed to the window pane include solar cells 12, a switching unit 13, a pulse width modulation or switching controller 14, and a photo-transistor 15. The ferrite core 16 is also normally permanently fixed to the pane 10 and supplied, in use, with an oscillating current derived from power generated in the solar cells by solar energy. Other electrical components, that are normally attached to the pane or mounted nearby in use, include a ferrite core 17, an AC to DC converter 18, and an LED external controller 19 that provides light signals for adjusting the output power of the solar cells via the phototransistor 15. A lid 20 (see FIG. 1), in which the core 17, the converter 18, and the controller 19 may be fixedly mounted, is arranged to be glued or otherwise fixed in position on the pane 10 once the pane has been fixed to a window frame.

Figure 3:
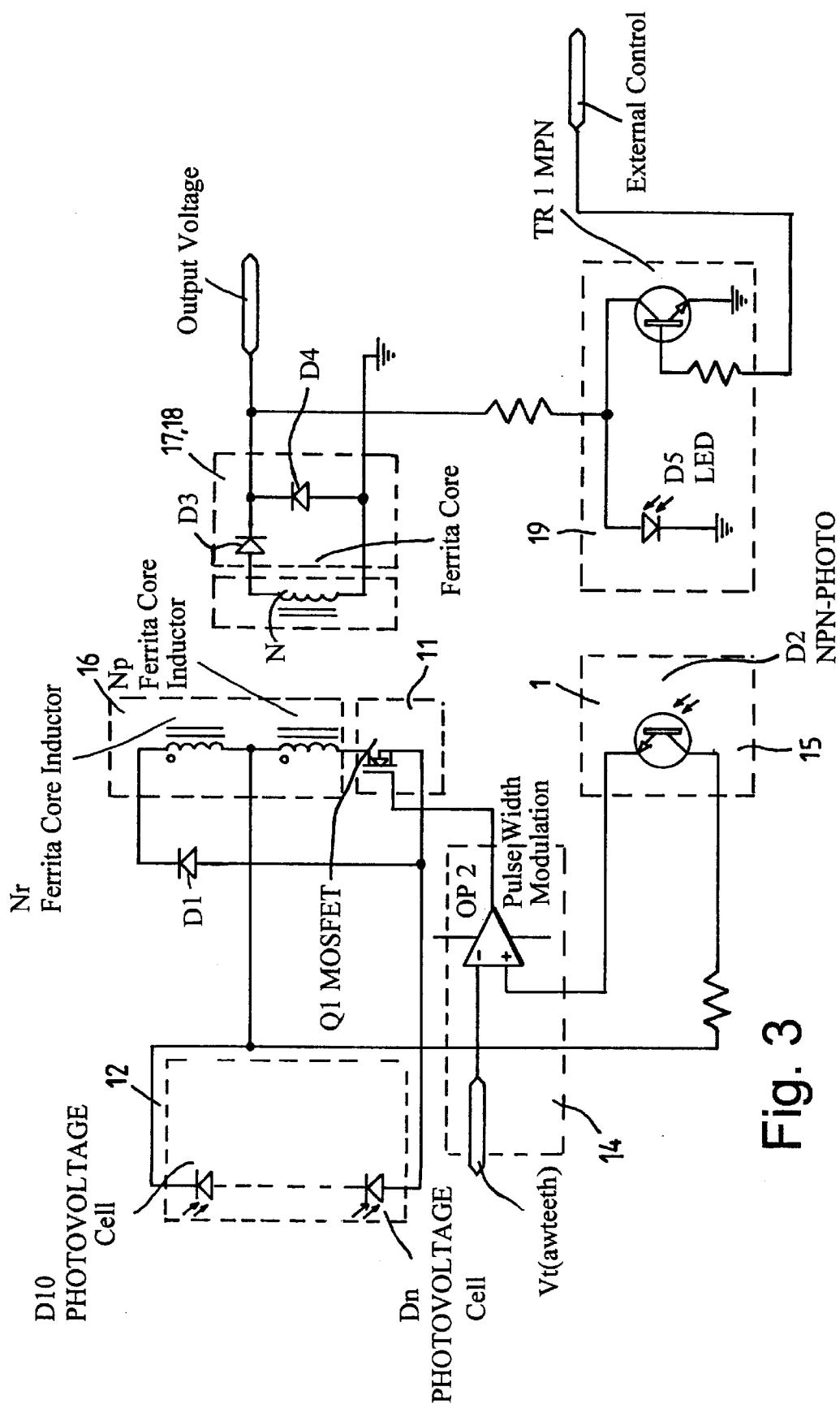
FIG. 3 is a circuit diagram of an electrical circuit of the solar panel arrangement.

In FIG. 3, the circuit is marked with reference numerals that correspond to the equivalent components in FIG. 2.

In use, power generated in the cells 12 is converted into ar. oscillating current that is fed to the ferrite core 16. Power is transferred to the ferrite core 17 and lead away in a cable 21 for use at a point-of-need. The power supply can be controlled or adjusted by the controller 19. Adjusting the power may be carried out manually, by varying a direct current supply to the controller 19, or automatically, under the control of a time switch, for example.

In any event, the described panels may be prepared or manufactured in bulk and once fitted to a building, their electrical connections for using solar energy derived power is simply made without the need for skilled labor. It is only necessary to bring up the ferrite core 17 into close proximity with the ferrite core 16 so as to create a close magnetic flux path between the cores, and to glue or otherwise support the ferrite core 17 in position. Likewise, the controller 19, or at least the LED of the controller, can also be glued or otherwise fixed close to the photo-transistor 15, In this way, making "electrical" connections to enable useful power to be derived from solar cells at a window of a normal building is significantly simplified, and can be carried out speedily by unskilled labor.

It will be appreciated that the ferrite core 17 itself may not be necessary. In some embodiments therefore, the core 16 is arranged to accept a wound electrical coil, that can be encapsulated on a former, that fits snugly over the wound core 16. In such an arrangement, magnetic flux generated in the core 16 from the solar energy likewise or as before creates current in the encapsulated coil for use in the building.

What is claimed is:

1. A window pane assembly for generating electricity in response to light comprising:

a window pane in which are embedded a number of solar cells, an electrical circuit permanently electrically connected to the solar cells and converting direct current generated by the solar cells in response to solar energy into oscillating current, and an external circuit magnetically coupleable to the electrical circuit for conveying electrical energy generated by the solar cells from the window pane and mountable on the window pane.

2. The window pane assembly according to claim 1, in which the electrical circuit includes an adjustable controller mounted to the window pane for changing the oscillating current and that is remotely adjustable external of the window pane.

3. The window pane assembly according to claim 2, in which the controller includes a photo-transistor.

4. The window pane assembly according to claim 1, wherein the external circuit includes a first ferrite core and the electrical circuit includes a second ferrite core mountable in close proximity to the first ferrite core.

* * * * *